United States Patent
Moe (10) Patent No.: US 9,628,262 B1
(45) Date of Patent: Apr. 18, 2017

(54) SPUR REDUCTION IN PHASE LOCKED LOOPS USING REFERENCE CLOCK DITHERING

(71) Applicant: Texas Instruments Incorporated, Dallas, TX (US)

(72) Inventor: Marius Moe, Fetsund (NO)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/213,574

(22) Filed: Jul. 19, 2016

(51) Int. Cl.
- H03D 3/24 (2006.01)
- H04L 7/033 (2006.01)
- H04B 15/02 (2006.01)
- H04L 7/06 (2006.01)

(52) U.S. Cl.
CPC ........... H04L 7/0331 (2013.01); H04B 15/02 (2013.01); H04L 7/06 (2013.01)

(58) Field of Classification Search
None
See application file for complete search history.

(56) References Cited

U.S. PATENT DOCUMENTS

| | | | |
|---|---|---|---|
| 6,809,598 B1 | 10/2004 | Staszewski et al. | |
| 7,046,098 B2 | 5/2006 | Staszewski | |
| 7,145,399 B2 | 12/2006 | Staszewski et al. | |
| 7,183,860 B2 | 2/2007 | Staszewski et al. | |
| 7,365,609 B2 | 4/2008 | Waheed | |
| 7,532,679 B2 | 5/2009 | Staszewski | |
| 7,570,182 B2 | 8/2009 | Sheba et al. | |
| 7,920,081 B2 * | 4/2011 | Waheed | G04F 10/005 331/17 |
| 8,045,670 B2 | 10/2011 | Waheed et al. | |
| 8,779,817 B2 * | 7/2014 | Jakobsson | H03L 7/1974 327/149 |
| 2008/0315928 A1 * | 12/2008 | Waheed | G04F 10/005 327/159 |
| 2009/0081984 A1 * | 3/2009 | Gailus | H03L 7/1974 455/323 |
| 2011/0148676 A1 * | 6/2011 | Waheed | G04F 10/005 341/131 |
| 2012/0244824 A1 * | 9/2012 | Entezari | H03L 7/1806 455/114.2 |
| 2014/0091844 A1 * | 4/2014 | Jakobsson | H03L 7/1974 327/158 |
| 2015/0249455 A1 * | 9/2015 | Burg | H03L 7/113 327/159 |
| 2016/0182262 A1 * | 6/2016 | Leistner | G06F 1/025 370/338 |

* cited by examiner

*Primary Examiner* — Tesfaldet Bocure
(74) *Attorney, Agent, or Firm* — Ronald O. Neerings; Charles A. Brill; Frank D. Cimino (57) ABSTRACT

An embodiment of the present disclosure provides a phase locked loop. A controllable oscillator generates a radio frequency (RF) signal. A divider is configured to produce a divided RF signal by dividing the RF signal by a division factor. A phase detection circuit is configured to receive a dithered reference signal and the divided RF signal and to produce a phase error signal for controlling the oscillator. A dithering module is configured produce the dithered reference signal and the division factor, in which the dithered reference signal has a randomly changing frequency selected from a plurality of dither frequencies, and in which the division factor is synchronously selected to match a ratio between each selected dither frequency and a target frequency of the RF signal.

20 Claims, 7 Drawing Sheets

SPUR REDUCTION IN PHASE LOCKED LOOPS USING REFERENCE CLOCK DITHERING

FIELD OF THE INVENTION

This invention generally relates synthesizing a frequency signal using a phase locked loop, and in particular to spur reduction using reference clock dithering.

BACKGROUND OF THE INVENTION

Digital radio has recently allowed the replacement of space consuming analog RF circuitry with much more compact digital circuitry, thereby facilitating the ability to port designs rapidly to more advanced lithographies. Texas Instruments (TI) has proven this concept with its Digital RF Processor (DRP™) architecture, which it has successfully implemented in production versions of its Bluetooth BRF6xxx transceivers, among other chips. DRP implementation is consistent with the on-going trend toward RF-CMOS in the cellular area, making it attractive in terms of power consumption, cost, and the integration of multiple radios.

Phase Locked Loop (PLL) Oscillators are a key component in the design of radio frequency (RF) communication systems.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

PLLs (phase locked loops) are a popular way of generating multiple frequencies from a single reference frequency. In radio frequency (RF) communication, PLLs are often used to generate RF frequencies (up to several GHz) from a single crystal (XTAL) based frequency reference circuit operating in the tens of MHz range. Typically the RF oscillator output is divided down by an RF signal divider and compared with a reference clock coming from the XTAL reference circuit. The comparator then generates an error signal which is filtered by a loop filter and the filtered signal is used to control the high frequency oscillator in such a manner that the error signal is minimized.

The general operation of PLLs is well known and need not be described in detail herein. For example, an all-digital frequency synthesizer architecture built around a digitally controlled oscillator (DCO) that is tuned in response to a digital tuning word (OTW) is described in U.S. Pat. No. 8,045,670 entitled "Interpolative All-digital Phase Locked Loop," which is incorporated by reference herein. The Interpolative All-Digital Phase Locked Loop (iADPLL) is an enhanced version of the All-digital PLL (ADPLL) frequency synthesizer, which is described in U.S. Pat. No. 7,145,399 entitled "Type-II all digital phase locked loop (PLL)," which is incorporated by reference herein.

A common problem in frequency synthesizers is spurs and/or tones that are generated spuriously. There are many sources for these spurs/tones, but a very common and problematic one is the reference clock. The reference clock may cause spurs/tones both within the loop bandwidth (at frequencies that are fractions of the reference frequency), and outside the loop bandwidth at multiples at the reference clock frequency. These spurs/tones can cause problems both for communication and for regulatory compliance. Significant work is often needed for spur reduction to meet design requirements.

An embodiment of the present disclosure includes a phase locked loop in which a dither module provides pseudo-random dithering of the reference clock along with corresponding changes to the divider ratio used by the RF signal divider, as will be explained in more detail below.

Figure 1:
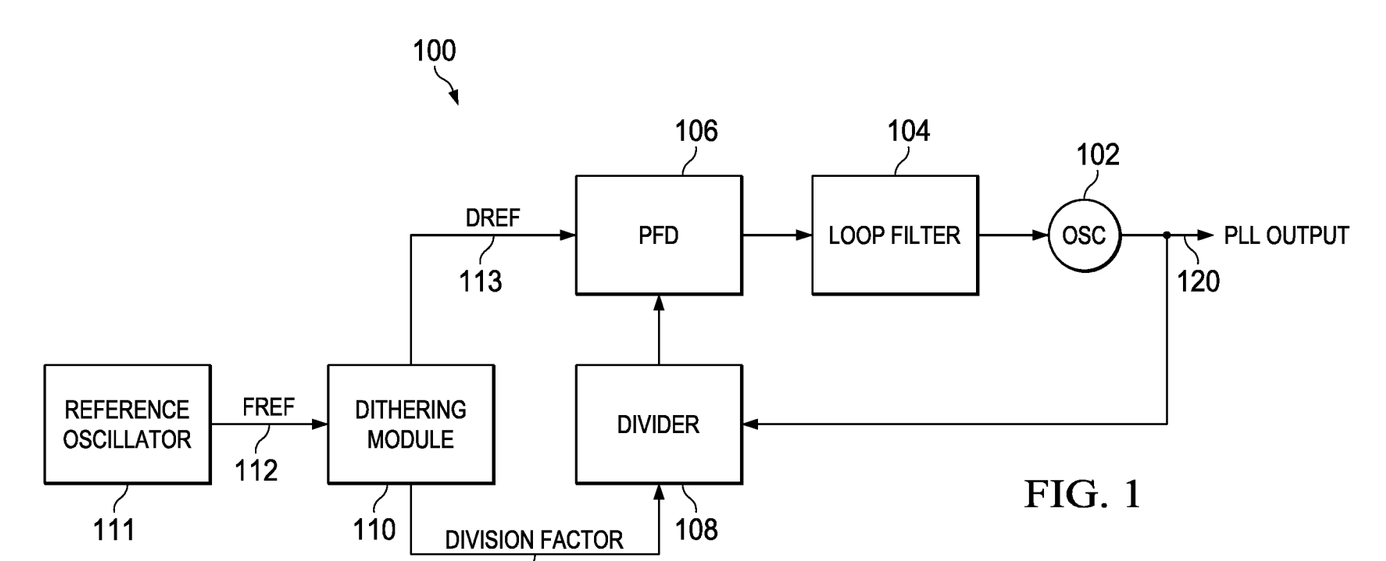
FIG. 1 is a block diagram of an example phase locked loop that includes a dithering circuit.

FIG. 1 is a block diagram of an example phase locked loop 100 that includes a dithering circuit 110 that is coupled to the reference clock circuit 111 and to the divider 108. The main loop of PLL 100 includes a controllable oscillator 102 that generates an RF clock signal 120 that has a target frequency. A phase detection circuit 106 operates on the dithered reference clock 113 to provide digital phase error samples indicative of a phase difference between the dithered reference clock and a divided version of the RF clock provided by divider 108. Loop filter 104 filters the phase error signal. Control logic then adjusts the operation of oscillator 102 in a manner that reduces the phase error signal to a minimum. As mentioned above, the basic operation of the main PLL loop is well known.

Embodiments of the present disclosure may vary the dithered reference clock 113 frequency in a random or pseudorandom sequence and at the same time vary the division factor 114 used by divider 108. The division factor is the ratio between the target frequency of the RF signal 120 produced by variable oscillator 102 and the dithered reference frequency 113 used by phase detector 106. In this manner, it is possible to break up the spurs/tones drastically by reducing the level of the spur peaks.

A stable oscillator circuit 111 generates a reference frequency (FREF) signal 112 that is provided to dither module 110. As mentioned above, stable oscillator 111 may be crystal based, or be based on other known or later developed techniques. Dither module 110 provides a random or pseudo-random dithering of the reference clock to form a dithered reference (DREF) clock 113 along with corresponding changes to the divider ratio 114.

Using dithering to break up tones in control loops is a well-known technique. Normally dithering is done by adding a random signal (noise) to the measured signal in the control loop. This may be effective in breaking up tones in a control loop, but it also increases the overall noise in the system. The overall noise is often increased by 3 dB in classical dithering schemes. Adding random noise to the loop does little to reduce the spurs at N*FREF. Also, coupling from the reference clock to other system signals, such as power supplies, will not be affected by adding more noise to the loop.

Embodiments of the present disclosure do not add noise to the loop to break up the tones, but instead work by creating a constantly changing loop. Embodiments of the present disclosure may implement dithering by changing the loop parameters in a random or in a pseudo-random way, without the need of adding noise to the system. Embodiments of the present disclosure change the loop dynamically making it essentially impossible for the tones to survive within the constantly changing loop environment. An embodiment of this disclosure may also reduce tones outside the loop bandwidth (multiples of the reference frequency) which a conventional dithering scheme fails to address.

Figure 2:
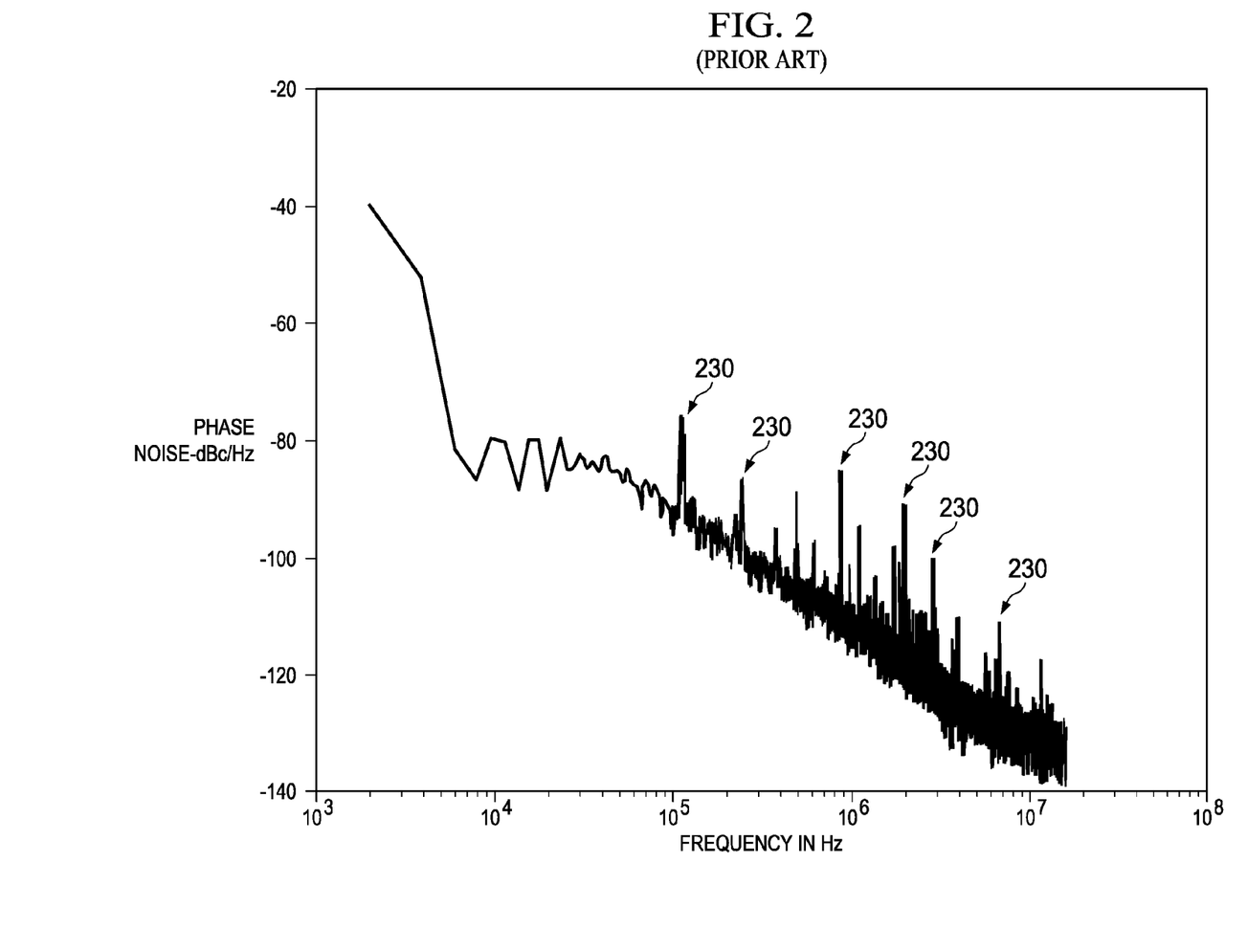
FIGS. 2 and 3 are plots of phase noise in different PLLs with and without dithering.

FIG. 2 is a plot of phase noise in an example prior art system using noise based dithering. An ideal oscillator would generate a pure sine wave. In the frequency domain, this would be represented as a single pair of Dirac delta functions (positive and negative conjugates) at the oscillator's frequency, i.e., all the signal's power is at a single frequency. All real oscillators have phase modulated noise components. The phase noise components spread the power of a signal to adjacent frequencies, resulting in noise sidebands. Oscillator phase noise often includes low frequency flicker noise and may include white noise. Phase noise is typically expressed in units of dBc/Hz, and it represents the noise power relative to the carrier contained in a 1 Hz bandwidth centered at a certain offsets from the carrier. Phase noise can be measured and expressed as single sideband or double sideband values, for example.

As can be seen in FIG. 2 as indicated by peaks 230, a large number of spurious phase noise pulses are present in this prior art example.

Figure 3:
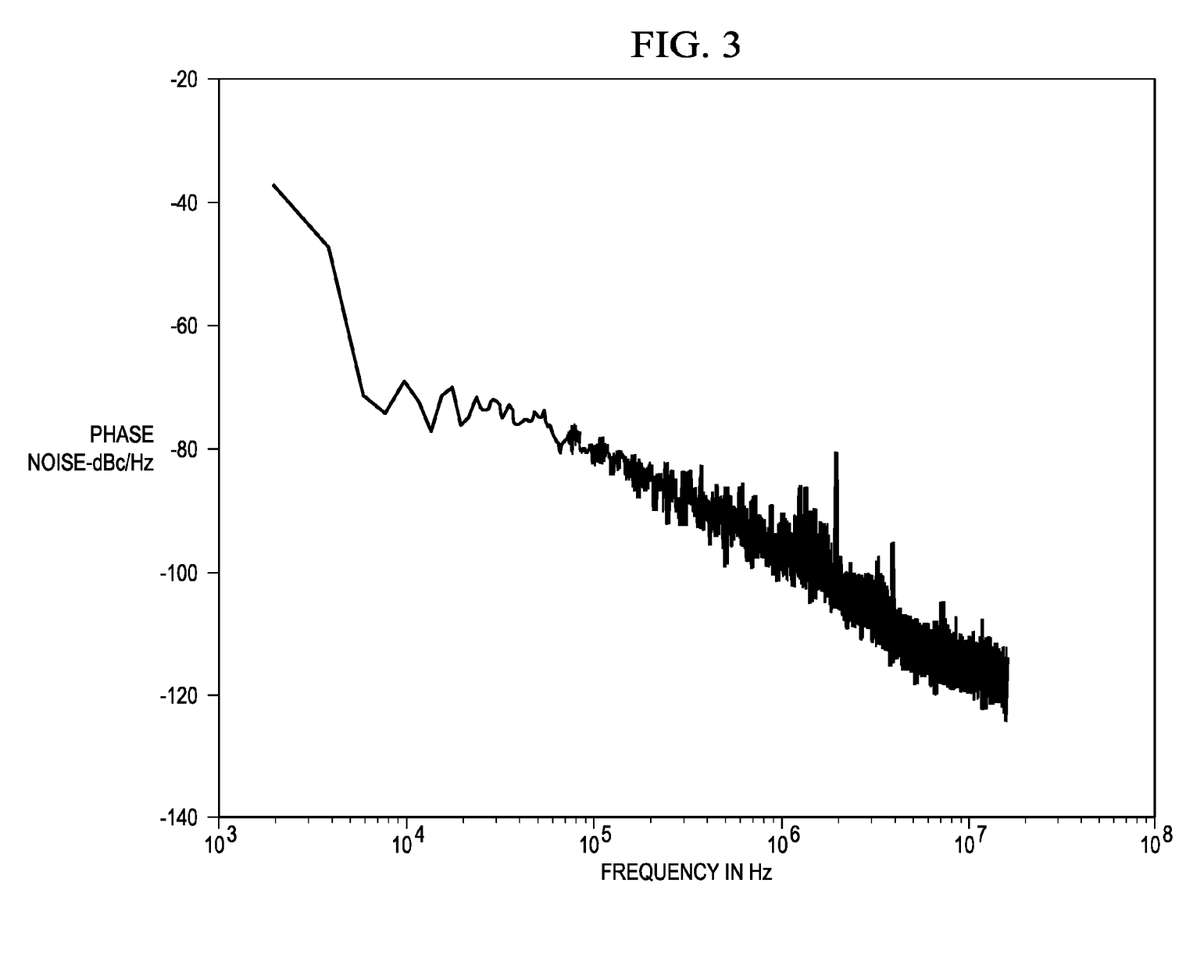

FIG. 3 is a plot of phase noise produced by an exemplary embodiment of the present disclosure in which the reference signal is dithered, as described above. Note that there are few spurious pulses in this example. The spurious energy is spread out over more frequencies due to the constantly changing dithered reference signal, effectively spreading the noise.

Figure 4:
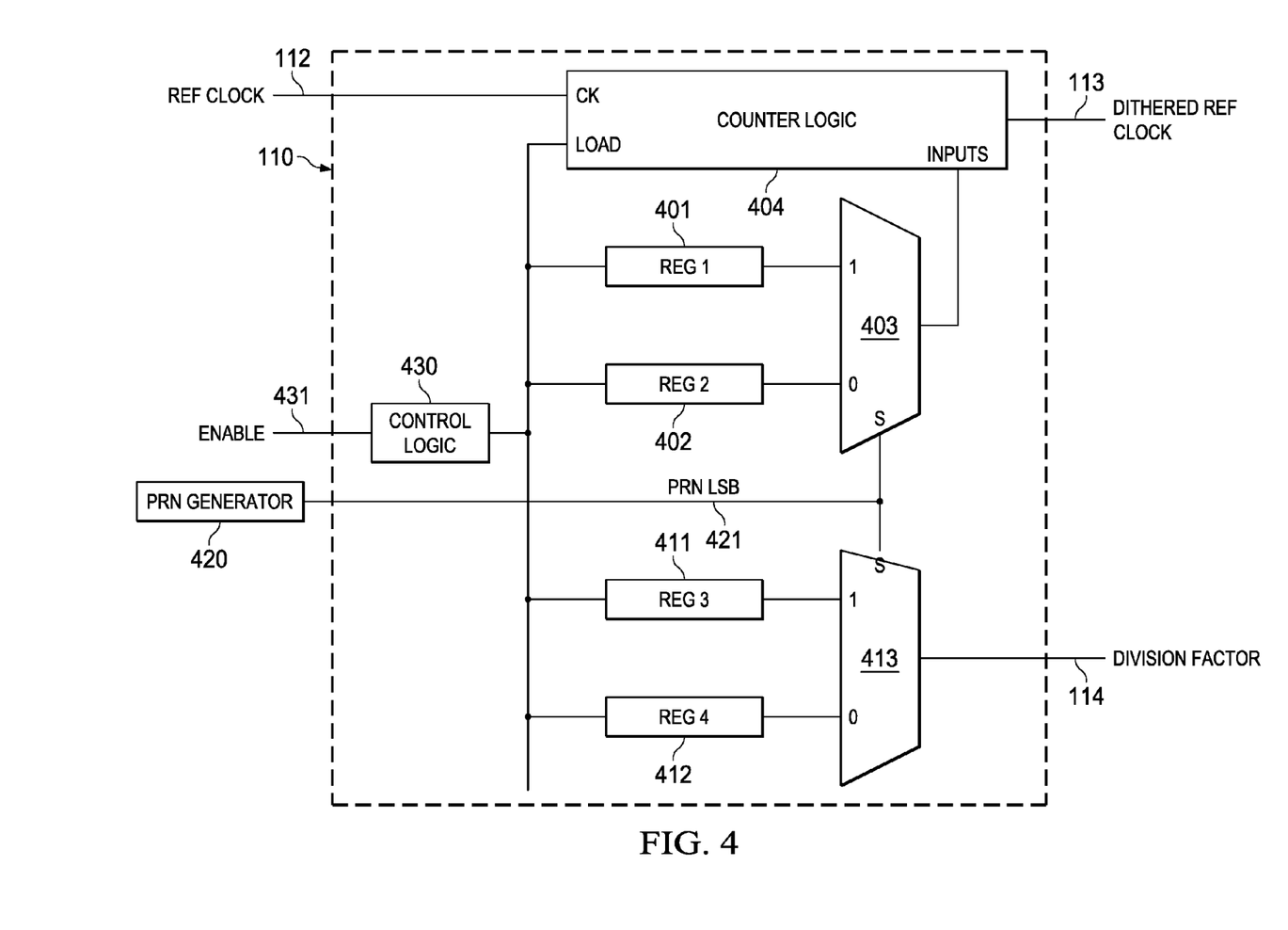
FIG. 4 is a more detailed block diagram of the dithering module of FIG. 1.

FIG. 4 is a block diagram of dithering module 110, referring back to FIG. 1. Counter logic 404 may be periodically loaded with a count value C that is used to count a number of periods of the ref clock 112. Each time the counter completes a count, the output may be toggled to produce one period of the dithered reference signal 113 every C periods of the reference signal, thereby dividing the reference clock frequency by the count value. In this example, two registers 401, 402 are illustrated. However, in another embodiment more than two registers may be used to produce more than two dither selections. In this example, register 401 may be loaded with a value "N." Register 402 may be loaded with a value "M." A selector 403 selects one or the other outputs from register 401, 402 to form dithered ref clock signal 113. Selector 403 is controlled by selection signal 421 that in this example is a least significant bit (LSB) of a pseudo random number (PRN) generated by PRN generator 420. In this example, ref clock 112 is a 24 MHz signal; therefore, dithered ref clock 113 is dithered between 24 MHz/N and 24 MHz/(M) at a rate determined by PRN generator 420. In this example, PRN generator 420 is designed to produce an average dither rate of less than one microsecond.

In addition to dithering the frequency of the reference clock, the PLL division factor 114 (PLL_DF_VALUE) used by divider 108, referring back to FIG. 1, may also be dithered between PLL_DF_VALUE*(N) and PLL_DF_VALUE*(M) to compensate for the changes in the ref clock 113 period. These two values may be calculated and stored in registers 411, 412 and selected by selector 413 using the same selection signal 421. These two values may be calculated by hardware in control logic 430, for example. In other embodiments, higher level control logic may calculate these values using software or hardware logic and store the results in registers 411, 412.

In some embodiments, the value of M may be selected to be N+1. In this case, a first division factor determined for a dithered frequency of FREF/N may have a value of PLL_1_Value. A second division factor for a dithered frequency of FREF/N+1) may be calculated as PLL_2_Value=PLL_1_Value*(N+1)/N. The (N+1)/N calculation may be done by hardware within control logic module 430, for example. To avoid division, the N may be selected to be a power of two, in which case the calculation simplifies to a shift and add operation. In this example, the following N values may be used: N=2, N=4, N=8, N=16. This corresponds to dithered ref clock frequencies of 12 MHz, 6 MHz, 3 MHz, and 1.5 MHz.

In some embodiments, control logic 430 may include an enable signal 431 that is controlled by higher level control logic. In this case, dithering may be selectively enabled and disabled by the higher level control logic.

Figure 5:
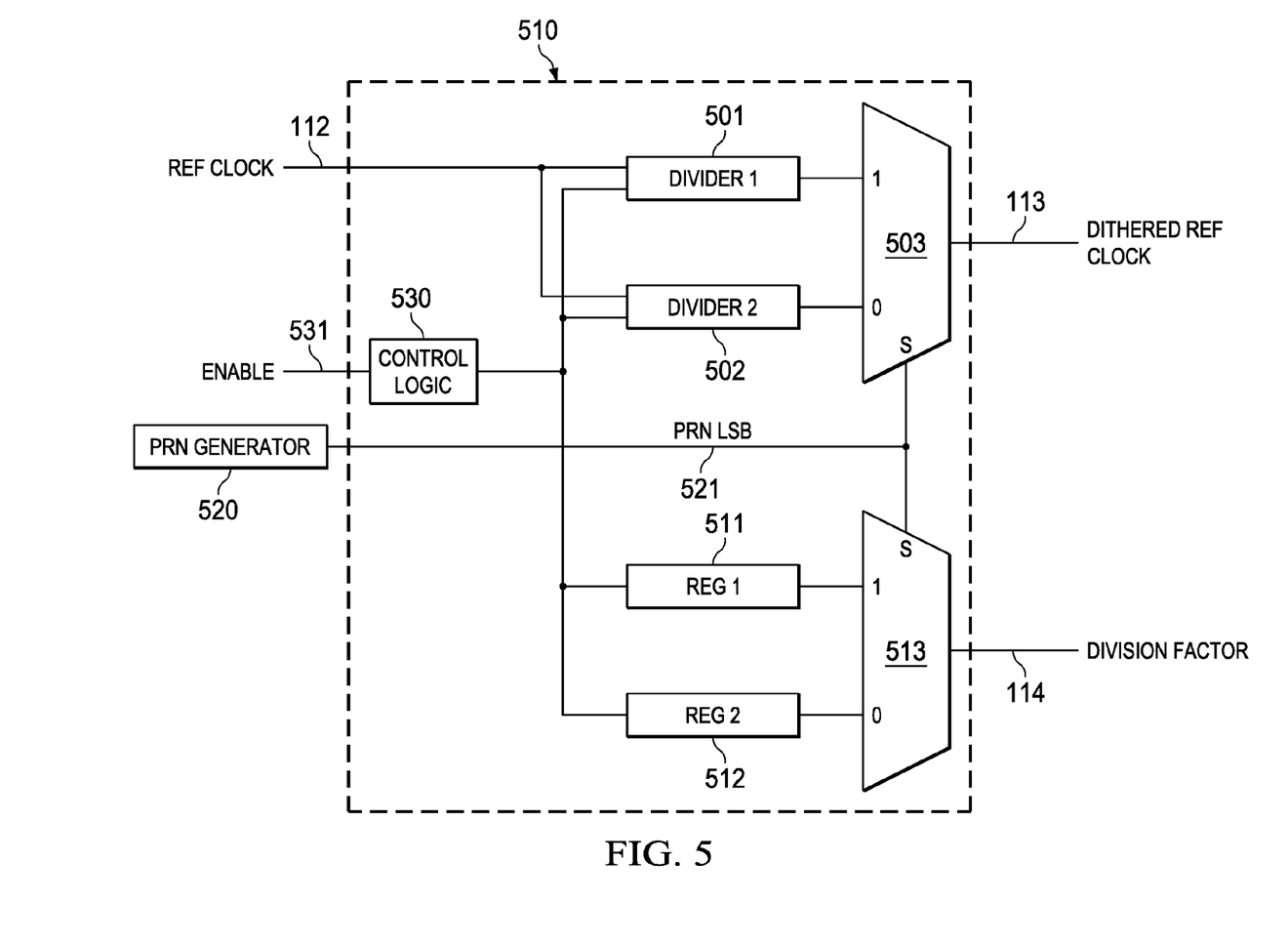
FIG. 5 is an alternative embodiment of the dithering module of FIG. 1.

FIG. 5 is a block diagram of an alternative embodiment of a dithering module 510. In this example, two reference clock dividers 501, 502 are illustrated. However, in another embodiment more than two dividers may be used to produce more than two dither selections. In this example, divider 501 may divide the ref clock 112 by a value "N." Divider 502 may divide ref clock 112 by a value "M," which may be N+1, for example. A selector 503 selects one or the other outputs from dividers 501, 502 to form dithered ref clock signal 113. Selector 503 is controlled by selection signal 521 that in this example is a least significant bit (LSB) of a pseudo random number (PRN) generated by PRN generator 520. In this example, ref clock 112 is a 24 MHz signal; therefore, dithered ref clock 113 is dithered between 24 MHz/N and 24 MHz/(M) at a rate determined by PRN generator 520. In this example, PRN generator 520 is designed to produce an average dither rate of less than one microsecond.

In order to maintain a constant frequency on the RF signal, the PLL division factor 114 (PLL_DF_VALUE) used by divider 108, referring back to FIG. 1, may be dithered between PLL_DF_VALUE*(N) and PLL_DF_VALUE*(M) to compensate for the changes in the ref clock 113 period. These two values may be calculated as described above in more detail, be stored in registers 511, 512 and be selected by selector 513 using the same selection signal 521.

In some embodiments, control logic 530 may include an enable signal 531 that is controlled by higher level control logic. In this case, dithering may be selective enabled and disabled by the higher level control logic.

Dividers 501, 502 may be implemented using various known or later developed divider circuits. For example, a simple binary counter clocked by the input ref clock signal 112 may be used for power-of-2 integer division. The least-significant output bit alternates at ½ the rate of the input clock, the next bit at ¼ the rate, the third bit at ⅛ the rate, etc.

Alternatively, an arrangement of flipflops may be used for integer-n division. The easiest configuration is a series where each flip-flop is a divide-by-2. For a series of three of these, such system would be a divide-by-8. By adding additional logic gates to the chain of flip flops, other division ratios may be obtained.

Another popular circuit to divide a digital signal by an even integer multiple is a Johnson counter. This is a type of shift register network that is clocked by the input signal. The last register's complemented output is fed back to the first register's input. The output signal is derived from one or more of the register outputs. For example, a divide-by-6 divider can be constructed with a 3-register Johnson counter. The six valid values of the counter are 000, 100, 110, 111, 011, and 001. This pattern repeats each time the network is clocked by the input signal. The output of each register is an f/6 square wave with 60° of phase shift between registers. Additional registers can be added to provide additional integer divisors.

In another embodiment, there may be only a single divider, such as divider 502. In this case, selection logic 503 may randomly select between ref clock 112 and a divided version of ref clock provided by divider 502. A similar configuration may be embodied using counter logic such as logic 404 in FIG. 4 in place of divider 502.

Figure 6:
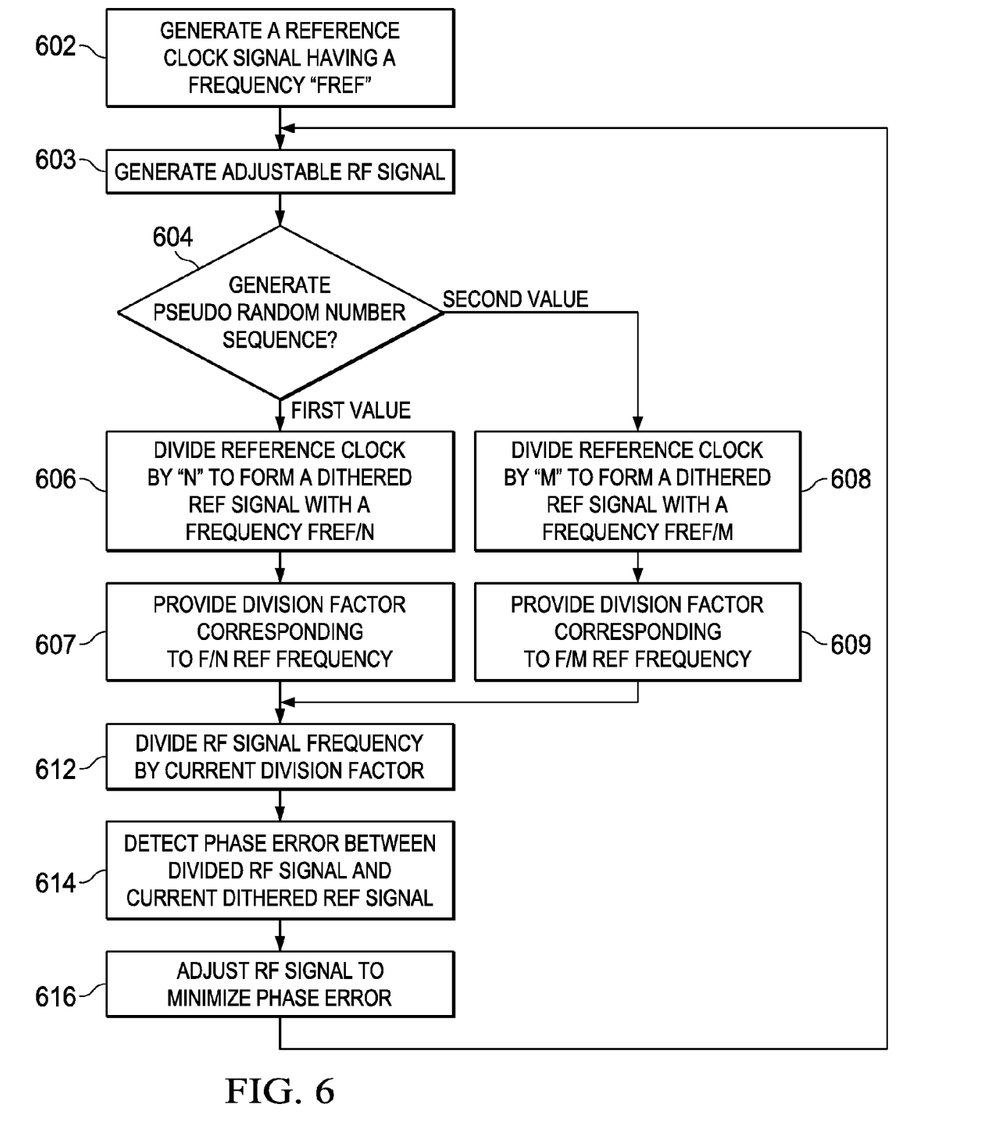
FIG. 6 is a flow chart illustrating operation of an example PLL.

FIG. 6 is a flow chart illustrating operation of generating an RF signal using an example PLL that operates by dithering the frequency of a reference dock that is used within a feedback loop. The feedback loop divides the RF signal by a division factor that is synchronously selected to correspond to the dithered reference signal, as described above in more detail.

A fixed frequency reference clock signal having a frequency "FREF" may be generated 602 using a crystal oscillator or other known or later developed circuit or device.

An adjustable RF signal that has a target frequency may be generated 603 using an adjustable RF oscillator, as described in more detail above.

A random or pseudo random sequence of numbers may be generated 604 using a hardware or software logic module, for example. A selection signal may then be formed based on the random or pseudo random sequence, such as by using a least significant bit value, for example.

When the selection signal has a first value, such as "0," the frequency of the reference clock may be divided 606 by a value "N" to form a dithered reference signal having a frequency of FREF/N. When the selection signal has a second value, such as "1," the frequency of the reference clock may be divided 608 by a value "M" to form a dithered reference signal having a frequency of FREF/M. As described above in more detail, the dithered reference signal may be formed by a counter using different count values responsive to the selection signal, by a divider using multiple divisor values responsive to the selection signal, by multiple dividers responsive to the selection signal, etc. In some embodiments, N may be equal to "1," in which case no division of FREF is required to form FREF/N.

In each case, a divider value is provided 607, 609 to the feedback loop of the PLL whose value is selected to match a ratio between each selected dither frequency and the target frequency of the RF signal.

The frequency of the RF signal is periodically divided 612 by the current division factor that corresponds to the current frequency of the dithered reference signal. This division may be performed by actually dividing the RF signal frequency, or by counting a number of periods of the RF signal over a defined period of time, or by other known or later developed techniques.

A phase error may then be detected 614 between the current frequency of the dithered reference signal and the resultant divided RF signal. The adjustable RF oscillator may then be dynamically adjusted 616 to minimize the detected phase error.

This process then repeats continuously using the random or pseudo random number sequence to dither the reference signal and loop division factor. In the example embodiment of FIG. 1, the random number sequence is configured to cause a dither selection to occur at an average rate of less than approximately 1 microsecond/switch.

In this manner, it is possible to break up the spurs/tones produced by the PLL drastically by reducing the level of the spur peaks.

System Example

Figure 7:
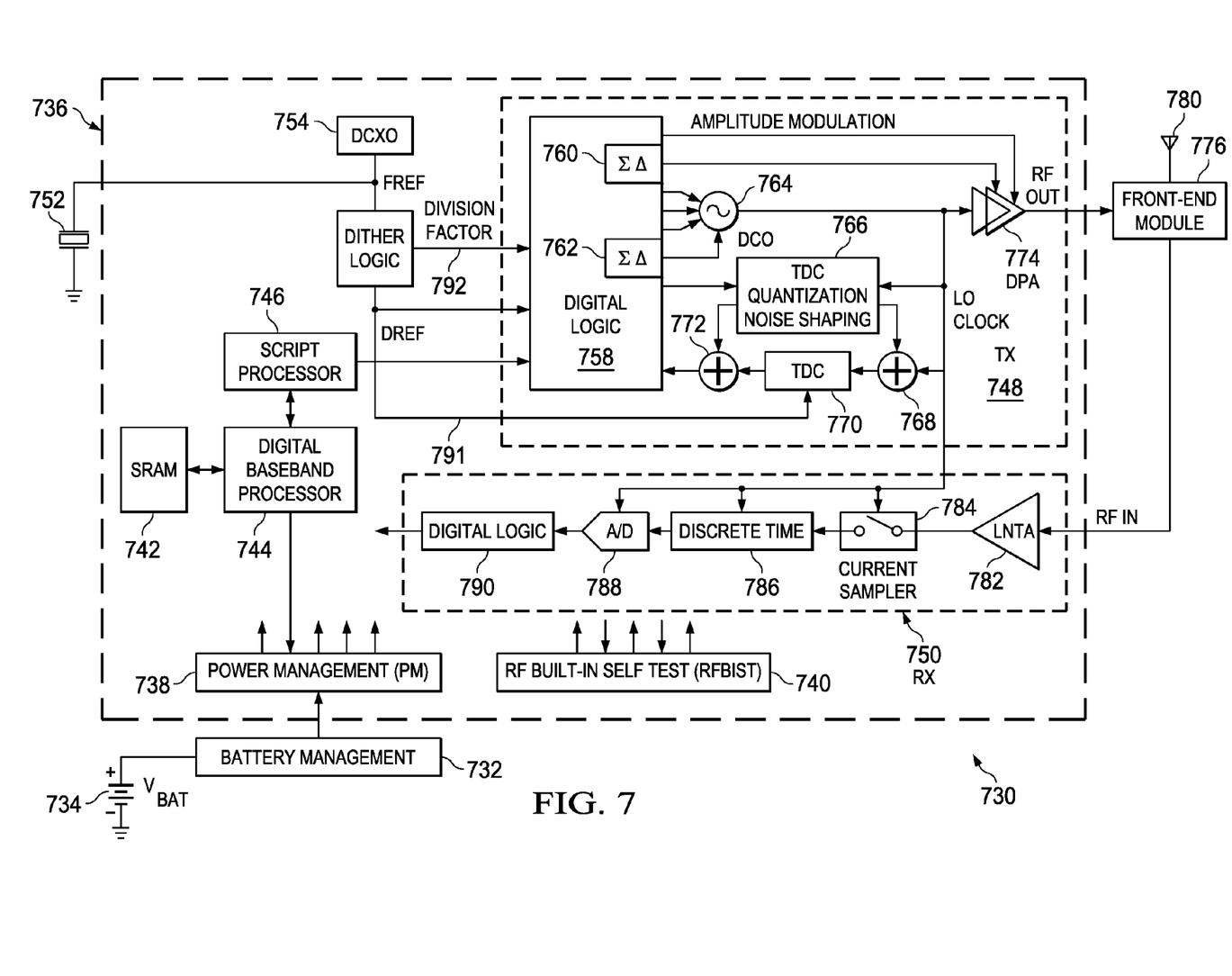
FIG. 7 is a block diagram of an example digital system with an embodiment of a PLL within a digital radio transceiver.

FIG. 7 is a block diagram of an example communication device 730. Digital system 730 includes an embodiment of a PLL that uses a dithered reference signal (DREF) 791 within a digital radio transceiver. For illustration purposes only, a example transmitter 748, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present disclosure.

The radio circuit, generally referenced as 730, may include an integrated circuit (IC) 736 coupled to a crystal 752, antenna front end module 776 connected to antenna 780 and battery management circuit 732. The radio IC 736 may include a script processor 746, digital baseband (DBB) processor 744, memory 742 (e.g., static RAM), transmit (TX) block 748, receiver (RX) block 750, digitally controlled crystal oscillator (DCXO) 754, dither logic 790, power management unit 738, and RF built-in self test (BIST) 740. Battery 734 and battery management circuit 732 may be connected to radio chip 736 for providing power. TX block 748 may include high speed and low speed digital logic block 758 including sigma-delta (IA) modulators 760, 762, digitally controlled oscillator (DCO) 764, digitally controlled power amplifier (DPA) 774 or pre power amplifier (PPA), time-to-digital converter (TDC) circuit 770 and TDC quantization noise shaping block 766. RX block 750 may include a low noise transconductance amplifier 782, current sampler 784, discrete time processing block 786, analog to digital converter (ADC) 788 and digital logic block 790.

A frequency reference (FREF) is generated on-chip by a 38.4 MHz (but could be 26.0 MHz or other in another embodiment) digitally controlled crystal oscillator (DCXO) 754 coupled to dither logic 790.

An embedded PLL is formed by DCO 764, TDC 770 and control logic 758. The general operation of the radio chip with an embedded PLL is described in more detail in U.S. Pat. No. 8,045,670, which is incorporated by reference herein. Dither logic 790 provides an improvement to the operation of the PLL described therein by dithering the frequency of the dither reference clock signal 791 randomly between two or more frequencies as described above in more detail. A corresponding division factor 792 is synchronously provided to TDC 770. As described above in more detail, the division factor is selected such that a ratio between each selected dither frequency and the division factor is a constant. The TDC measures and quantizes the time differences between the dithered frequency reference DREF 791 and the DCO clock edges.

Other Embodiments

While the invention has been described with reference to illustrative embodiments, this description is not intended to be construed in a limiting sense. Various other embodiments of the invention will be apparent to persons skilled in the art upon reference to this description.

To aid in understanding the principles of the present disclosure, a description is provided in the context of a digital RF processor (DRP) transmitter and receiver that may be adapted to comply with a particular wireless communications standard such as GSM, Bluetooth, WCDMA, etc. It is appreciated, however, that the invention is not limited to use with any particular communication standard and may be used in various configurations, such as: wired, wave guide, and wireless applications, low frequency to optical or near optical frequencies, etc. Further, the invention is not limited to use with a specific modulation scheme but is applicable to any modulation scheme including both digital and analog modulation.

While a digital PLL was described herein, dithering of the reference frequency as disclosed herein may also be applied to an analog based PLL.

While examples of PLLs in which the reference clock operates at a frequency such as 24 MHz or 38.4 MHz and the dithering rate is less than one microsecond are disclosed herein, in other embodiments the dithering rate may be slower or even faster, depending on the reference clock frequency. For example, in some embodiments a reference clock may operate at a frequency in the low to medium kilohertz range. In such an embodiment, the dither rate may be as long as a kilosecond or more, for example.

Note that in this document, the term "communication device" is defined as any apparatus or mechanism adapted to transmit, or transmit and receive data through a medium. The communication device may be adapted to communicate over any suitable medium such as RF, wireless, infrared, optical, wired, microwave, etc. In the case of wireless communications, the communication device may comprise an RF transmitter, RF receiver, RF transceiver or any combination thereof.

While a mobile user equipment communication device has been described, embodiments of the invention are not limited to mobile devices. Desktop equipment and other stationary equipment may also embody a PLL as described herein.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. A digital system comprising a phase locked loop (PLL), wherein the PLL comprises:
   a controllable oscillator for generating a radio frequency (RF) signal having a target frequency;
   a divider coupled to receive the RF signal, the divider configured to produce a divided RF signal by dividing the RF signal by a division factor;
   a phase detection circuit configured to receive a dithered reference signal and the divided RF signal and to produce a phase error signal for controlling the oscillator; and
   a dithering module configured to receive a reference signal having a fixed frequency FREF, the dithering module operable to produce the dithered reference signal and the division factor, in which the dithered reference signal has a randomly changing frequency selected from a plurality of dither frequencies, and in which the division factor is synchronously selected to match a ratio between each selected dither frequency and the target frequency of the RF signal.

2. The PLL of claim 1, in which the dithering module includes:
   selection circuitry configured to randomly select a count value C from at least two defined dither values; and
   counting circuit operable to count each period of the reference signal and produce one period of the dithered reference signal every C periods of the reference signal.

3. The PLL of claim 2, further including a pseudo random number (PRN) generator, in which a bit signal of the PRN generator is coupled to control the selection circuitry.

4. The PLL of claim 2, in which the selection circuitry switches at an average time rate of less than one microsecond.

5. The PLL of claim 2, further including:
   storage for holding at least two division factor values; and
   selection logic configured to select a division factor corresponding to each selected count value.

6. The PLL of claim 1, in which the divider includes a counter configured to divide the RF signal by counting a number of periods of the RF signal defined by the division factor.

7. The PLL of claim 1, in which the dithering module includes:
   at least two dividers configured to divide the reference signal to form at least two divided reference signals; and
   selection circuitry configured to randomly select any of the at least two divided reference signals to form the dithered reference signal.

8. The PLL of claim 7, further including a pseudo random number (PRN) generator, in which a bit signal of the PRN generator is coupled to control the selection circuitry.

9. The PLL of claim 7, in which the selection circuitry switches at an average time rate of less than one microsecond.

10. The PLL of claim 7, further including:
    storage for holding at least two division factor values; and
    selection logic configured to select a division factor corresponding to each selected divided reference signal.

11. The digital system of claim 1 being a communication device, further including a transmitter having modulation logic configured to modulate the RF signal.

12. The communication device of claim 11, further including an RF receiver coupled to operate using the RF signal.

13. A method for operating a phase locked loop (PLL), the method comprising:
    generating a reference clock having a frequency FREF;
    generating an adjustable radio frequency (RF) signal having a target frequency;
    dithering the reference clock to generate a dithered reference clock having a randomly changing frequency selected from a plurality of dither frequencies;
    selecting a division factor to match a ratio between each selected dither frequency and the target frequency of the RF signal;
    dividing the RF signal by the selected division factor to produce a divided RF signal;
    detecting a phase error between the dithered reference dock and the divided RF signal; and
    adjusting the adjustable RF signal to minimize the phase error.

14. The method of claim 13, in which dithering the reference clock is performed by dividing the frequency of the reference clock each of two or more values in a random sequence.

15. The method of claim 14, in which the random sequence is a pseudo random sequence.

16. The method of claim 13, in which dithering the reference clock switches frequency of the dithered reference clock at an average time rate of less than one microsecond.

17. An integrated circuit comprising:
    a phase locked loop (PLL), in which the PLL includes:
    a controllable oscillator for generating a radio frequency (RF) signal having a target frequency;
    a control loop controllably coupled to the controllable oscillator; and
    a dithering module having a dithered reference signal output and a division factor output coupled to the control loop, in which the dithered reference signal has a randomly changing frequency selected from a plurality of dither frequencies, and in which the division factor is synchronously selected to match a ratio between each selected dither frequency and the target frequency of the RF signal.

18. The integrated circuit of claim 17, in which the control loop includes:
    a divider coupled to receive the RF signal, the divider configured to produce a divided RF signal by dividing the RF signal by the division factor; and
    a phase detection circuit configured to receive the dithered reference signal and the divided RF signal and to produce a phase error signal for controlling the oscillator.

19. The integrated circuit of claim 17, in which the dithering module includes:
    selection circuitry configured to randomly select a count value C from at least two defined dither values; and
    counting circuit operable to count each period of the reference signal and produce one period of the dithered reference signal every C periods of the reference signal.

20. The PLL of claim 19, further including a pseudo random number (PRN) generator, in which a bit signal of the PRN generator is coupled to control the selection circuitry.

* * * * *